(12) United States Patent
Nicholls

(10) Patent No.: US 9,264,017 B2
(45) Date of Patent: Feb. 16, 2016

(54) ELECTRONICALLY TUNABLE FILTER

(71) Applicant: NANOWAVE TECHNOLOGIES INC., Etobicoke (CA)

(72) Inventor: Charles William Tremlett Nicholls, Ottawa (CA)

(73) Assignee: Nanowave Technologies Inc., Etobicoke, Ontario (CA)

( * ) Notice: Subject to any disclaimer, the term of this patent is extended or adjusted under 35 U.S.C. 154(b) by 61 days.

(21) Appl. No.: 14/363,431

(22) PCT Filed: Apr. 4, 2013

(86) PCT No.: PCT/CA2013/050271
§ 371 (c)(1),
(2) Date: Jun. 6, 2014

(87) PCT Pub. No.: WO2014/161062
PCT Pub. Date: Oct. 9, 2014

(65) Prior Publication Data
US 2015/0326202 A1    Nov. 12, 2015

(51) Int. Cl.
*H03K 5/00* (2006.01)
*H03H 11/04* (2006.01)
*H04L 5/14* (2006.01)

(52) U.S. Cl.
CPC . *H03H 11/04* (2013.01); *H04L 5/14* (2013.01)

(58) Field of Classification Search
CPC ...................................................... H03H 11/04
See application file for complete search history.

(56) References Cited

U.S. PATENT DOCUMENTS

| 4,262,361 A | 4/1981 | Hauer |
| 6,054,948 A * | 4/2000 | Dean ...................... G01S 7/032 342/372 |
| 8,107,877 B2 | 1/2012 | Thomas et al. |
| 8,412,759 B2 | 4/2013 | Petrovic |

OTHER PUBLICATIONS

PCT/CA2013/050271 International Search Report and Written Opinion dated Dec. 23, 2013.

* cited by examiner

*Primary Examiner* — Daniel Puentes
(74) *Attorney, Agent, or Firm* — Curtis Behmann; Borden Ladner Gervais LLP

(57) ABSTRACT

An electronically tunable filter (ETF) and systems comprising an ETF are disclosed herein. The ETF comprises: a first image rejection mixer; a second image rejection mixer; a first hybrid coupler, the first hybrid coupler being coupled to the first image rejection mixer; a second hybrid coupler, the second hybrid coupler being coupled to the second image rejection mixer; an internal filter coupled to the first hybrid coupler and the second hybrid coupler; a control port for receiving a control signal; a power splitter coupled to the control port, the first image rejection mixer, and the second image rejection mixer; a first port coupled to the first image rejection mixer; and a second port coupled to the first image rejection mixer.

18 Claims, 20 Drawing Sheets

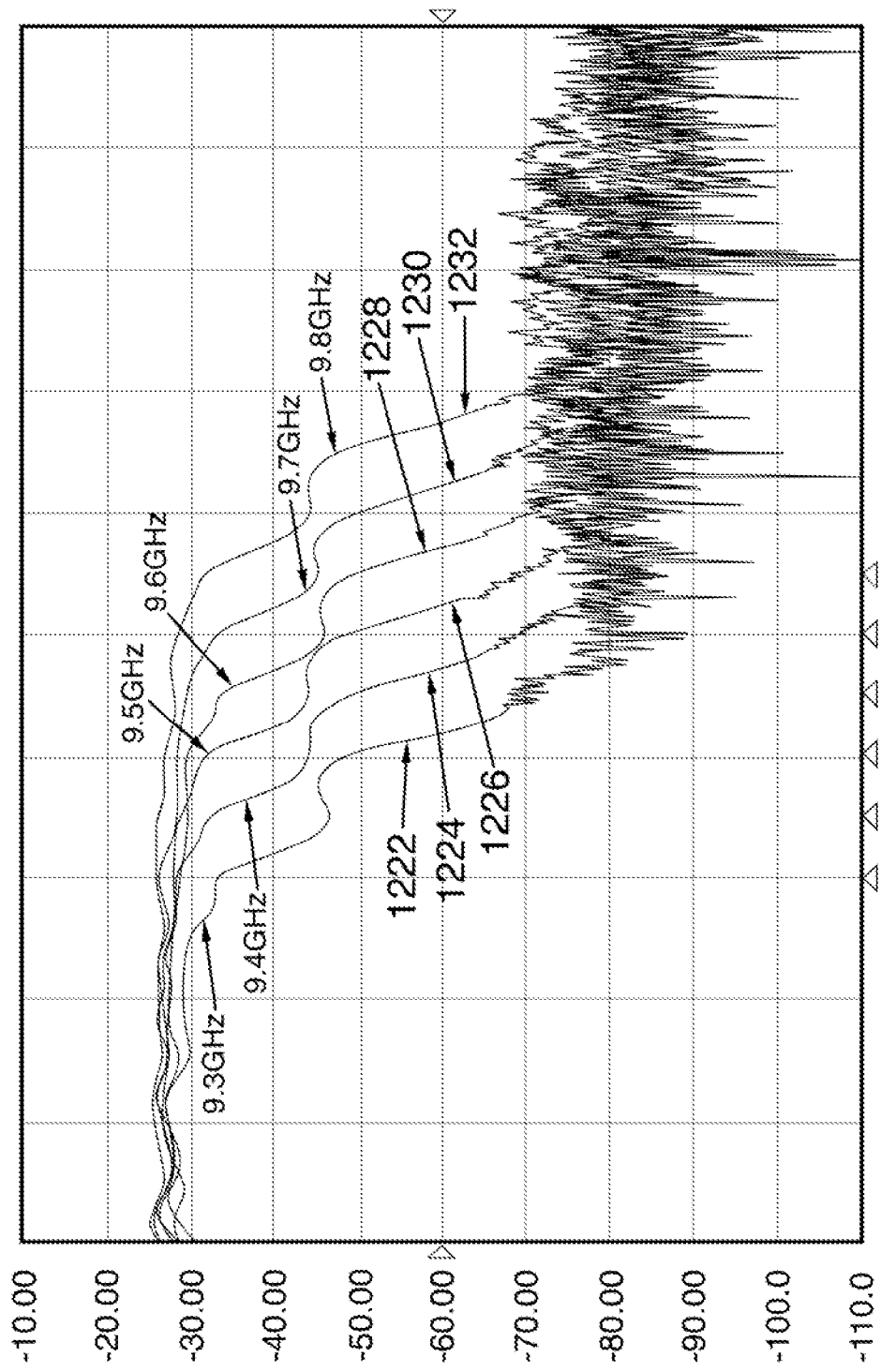

ELECTRONICALLY TUNABLE FILTER

FIELD

The present disclosure relates generally to filters. More particularly, the present disclosure relates to electronically tunable filters.

BACKGROUND

Radio systems are required to operate over specific frequency bands, as such all radio frequency systems require means to limit the bandwidth of operation of the system both in the transmission mode and the reception mode. Two broad categories of radio frequency system are RADAR and Telecommunications systems.

The above information is presented as background information only to assist with an understanding of the present disclosure. No determination has been made, and no assertion is made, as to whether any of the above might be applicable as prior art with regard to the present invention.

SUMMARY

In a first aspect, the present disclosure provides an electronically tunable filter (ETF), the filter comprising: a first image rejection mixer; a second image rejection mixer; a first hybrid coupler, the first hybrid coupler being coupled to the first image rejection mixer; a second hybrid coupler, the second hybrid coupler being coupled to the second image rejection mixer; an internal filter coupled to the first hybrid coupler and the second hybrid coupler; a control port for receiving a control signal; a power splitter coupled to the control port, the first image rejection mixer, and the second image rejection mixer; a first port coupled to the first image rejection mixer; and a second port coupled to the first image rejection mixer.

In some embodiments, the ETF further comprises a signal generator coupled to the control port for providing the control signal.

In some embodiments, the signal generator comprises a direct digital synthesizer. In various embodiments, the frequency band of operation of the filter is adjustable in steps of less than 1 Hz.

In various embodiments, each of the first port and the second port is operable as either an input port or an output port.

In some embodiments, the internal filter comprises: a first narrowband surface acoustic wave filter; and a second narrowband surface acoustic wave filter, the first and second narrowband surface acoustic wave filters being coupled in a cascade. In various embodiments, the first and second narrowband surface acoustic wave filters are configured to provide sharp transition bands and narrow bandwidth.

In some embodiments, the ETF further comprises: a first amplifier coupled between the first hybrid coupler and the internal filter; and a second amplifier coupled between the internal filter and the second coupler. In various embodiments, the ETF further comprises: a first switch coupled between the first amplifier and first hybrid coupler; and a second switch coupled between the second amplifier and the second hybrid coupler.

In a second aspect, the present disclosure provides a filter system comprising: a first electronically tunable filter according to claim 1; and a second electronically tunable filter according to claim 1, the second electronically tunable filter coupled to the first electronically tunable filter.

In some embodiments, the first and second electronically tunable filters are coupled in series. In various embodiments, the filter system further comprises an amplifier coupled between the first electronically tunable filter and the second electronically tunable filter.

In some embodiments, the filter system is configured to operate as an adjustable band pass filter by: operating the first electronically tunable filter as a low pass filter; and operating the second electronically tunable filter as a high pass filter.

In some embodiments, the filter system is configured to operate as an adjustable band pass filter by: operating the first electronically tunable filter as a band pass filter having a first pass band; and operating the second electronically tunable filter as a band pass filter having a second pass band. In various embodiments, the first pass band and the second pass band are overlapped to achieve a third pass band, the third pass band having a frequency range smaller than a frequency range of either the first or second pass band.

In some embodiments, the first and second electronically tunable filters are coupled in parallel. In various embodiments, the filter system is operated as a duplex filter.

In another aspect, the present disclosure provides a source harmonic rejection filter comprising: a frequency synthesizer; and an electronically tunable filter according to claim 1, the first port of the filter being coupled to an output of the frequency synthesizer.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures, wherein:

FIG. 12B illustrates measured performance data for a low pass mode operation of the filter of FIG. 11;

DETAILED DESCRIPTION

Figure 1:
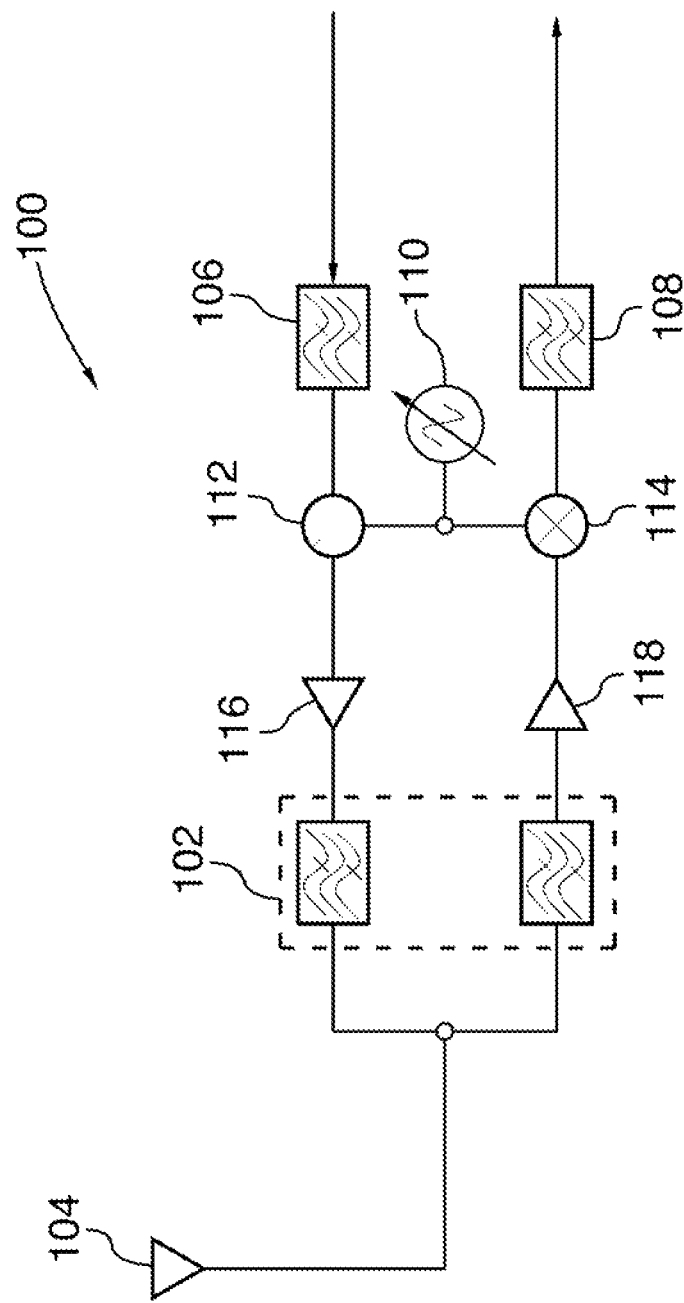
FIG. 1 is a block diagram of a known frequency duplex radio transceiver system.

For simplicity and clarity of illustration, reference numerals may be repeated among the figures to indicate corresponding or analogous elements. Numerous details are set forth to provide an understanding of the examples described herein. The examples may be practiced without these details. In other instances, well-known methods, procedures, and components are not described in detail to avoid obscuring the examples described. The description is not to be considered as limited to the scope of the examples described herein.

An example of a frequency duplex radio transceiver system 100 is shown in FIG. 1. The frequency duplex radio transceiver uses a different frequency for the transmitter and receiver. Transmit and receive signal frequencies are separated by means of a duplex filter 102 placed after the system antenna 104. Further filters, such as transmitter IF band pass filter 106 and receiver IF band pass filter 108, are used at the intermediate IF frequency of the system to select the operating channel for the system. Other components of system 100 include transceiver local oscillator 110, transmitter up conversion mixer 112, receiver down conversion mixer 114, transmitter power amplifier 116, and receiver low noise amplifier 118.

Non-idealities of the radio system transmission components lead to generation of energy outside the bandwidth of operation. Energy transmission is regulated to specific levels over specific bands. Accordingly, radio transmission equipment generally incorporates components which ensure energy transmission outside the bandwidth of operation meets regulatory requirements. Radio receivers generally must be able to be set to select specific frequency bands whilst rejecting all others. These requirements are met using radio frequency filter components.

The aforementioned are general requirements of radio frequency systems. The applicability of a radio frequency system is generally dependent on its ability to transmit and receive signals on selectable bands. In complex systems, the band of operation may change dynamically during signal transmission, as in the case of a frequency hopped system.

Filters are signal frequency conditioning components used to control signal power as a function of the signal frequency. Filters are used to set the frequency band over which a system operates. Fixed system bandwidth constrains the applicability of the system to a specific frequency band of operation.

In many situations, it is advantageous for a system bandwidth to be modified to enable access to other operating bands. In many cases, it is advantageous for the changes in system bandwidth to be electronically controlled and instantaneous with respect to the data transmission or reception speed of the system. The latter feature ensures that system information transmission or reception is uninterrupted by the reconfiguration of the operating band.

Figure 2:
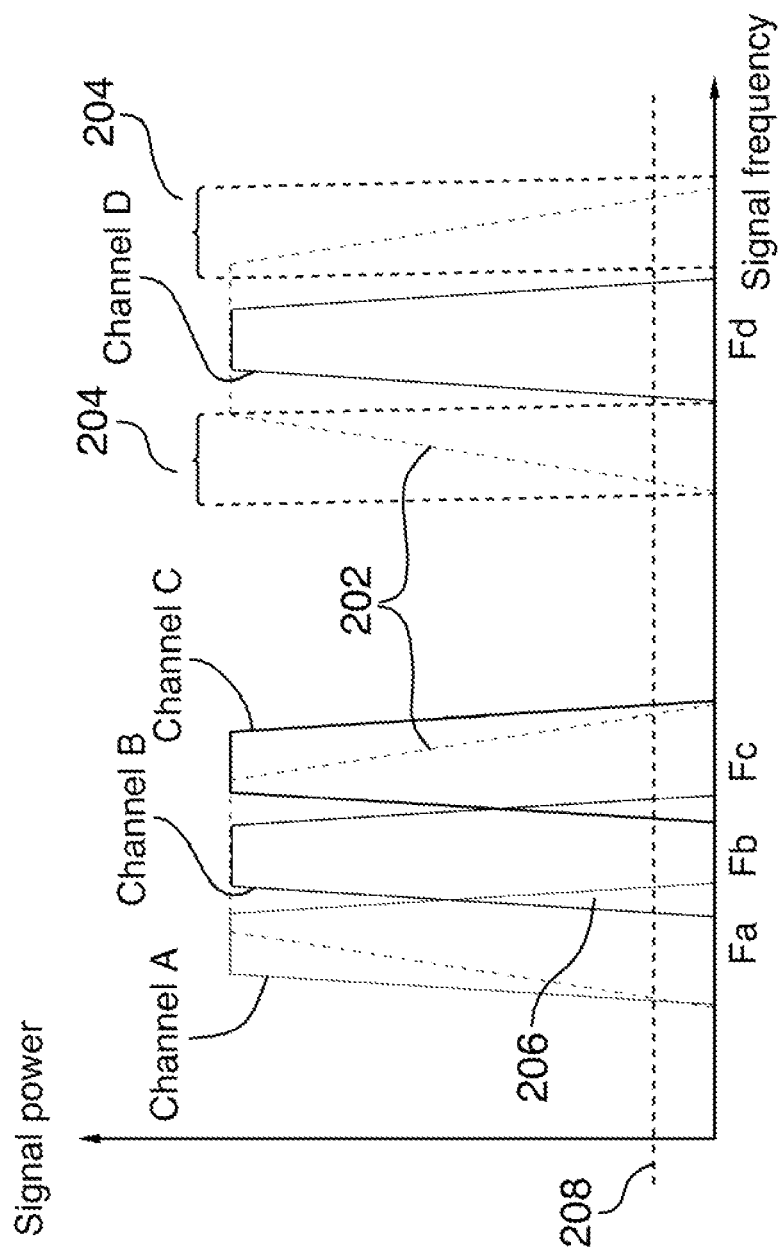
FIG. 2 is a graph illustrating frequency band usage.

In order to optimize frequency spectrum usage the frequency spacing between channels should be minimized. FIG. 2 is a graph of signal power vs signal frequency and illustrates frequency band usage. In FIG. 2 the pass band filter transition band 204 sets minimum frequency spacing between adjacent channels to avoid adjacent channel interference. The filter pass bands is indicated by 202. In the case that channel B is selected by the system, adjacent channels A and C will also be present in the receive band because the selection filter transition band 204 is too wide. Increasing the channel spacing decreases the spectral efficiency of the radio system but ensures that the adjacent channel interference 206 can be reduced below the level critical to the system operation; such is the case for channel D. The maximum permissible adjacent channel power is indicated at 208. The degree to which the channel spacing can be reduced is dependent upon the transition band of the filter systems used (see 204 of FIG. 2). In known systems, in order to achieve narrow transition bandwidths high quality factor resonators must be used in the synthesis of the filter structure.

Figure 3:
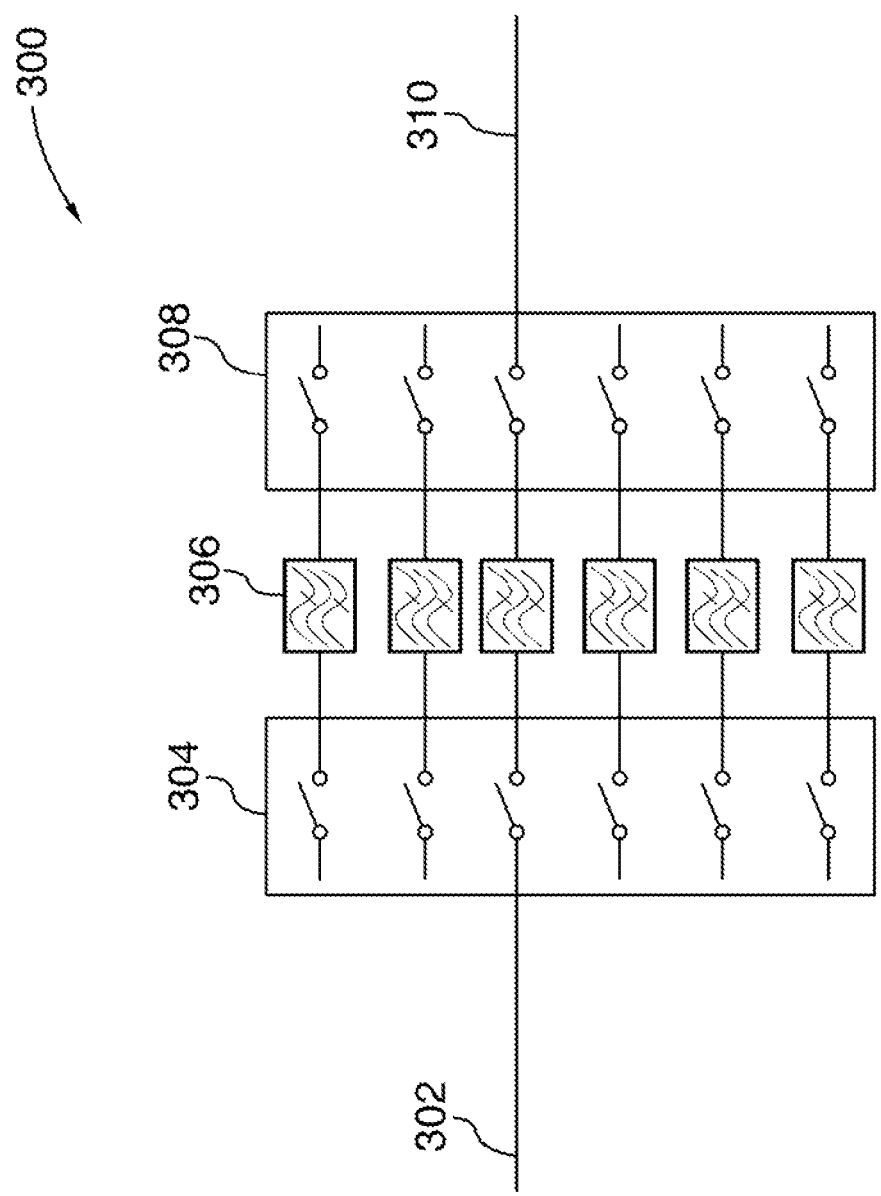
FIG. 3 is a block diagram of a switched filter bank.

High quality factor filters are not readily tuned across wide operating bandwidths, as such conventional radio frequency systems requiring steep filter transitions bands and broad operating bandwidths employ banks of switch selectable high selectivity filters. FIG. 3 illustrates a block diagram of switched filter bank 300. Filter bank 300 comprises switched filter input 302, a first solid state switch matrix 304, a filter bank 306, a second solid state switch matrix 308, a switched filter output 310.

Use of switched filter banks constrains the system operation to that of the finite number of filters used. A further challenge associated with the use of a switched filter bank is that of filter size. As the number of operating bands increases the filter bank size must also increase.

The present disclosure presents a new filter structure that, in some embodiments, meets the operation parameters of wide band operation, fast operating band reconfiguration speed and compact size. Various embodiments of the presented filter can operate as a high pass, low pass or band-pass structure. Some embodiments of the presented filter can also operate as a duplex mode filter providing two operating frequency bands. For some embodiments, the filter size and complexity does not increase as the number of operating bands increases. Various embodiments of the filter can be operated at an arbitrarily large number of frequency bands and band center frequencies set with high precision. A cascade of low and high pass filters of the type described in this disclosure can be operated to provide a filter with electronically adjustable center frequency and bandwidth. The applications of the various embodiments of the filter technology described herein are numerous.

Figure 4:
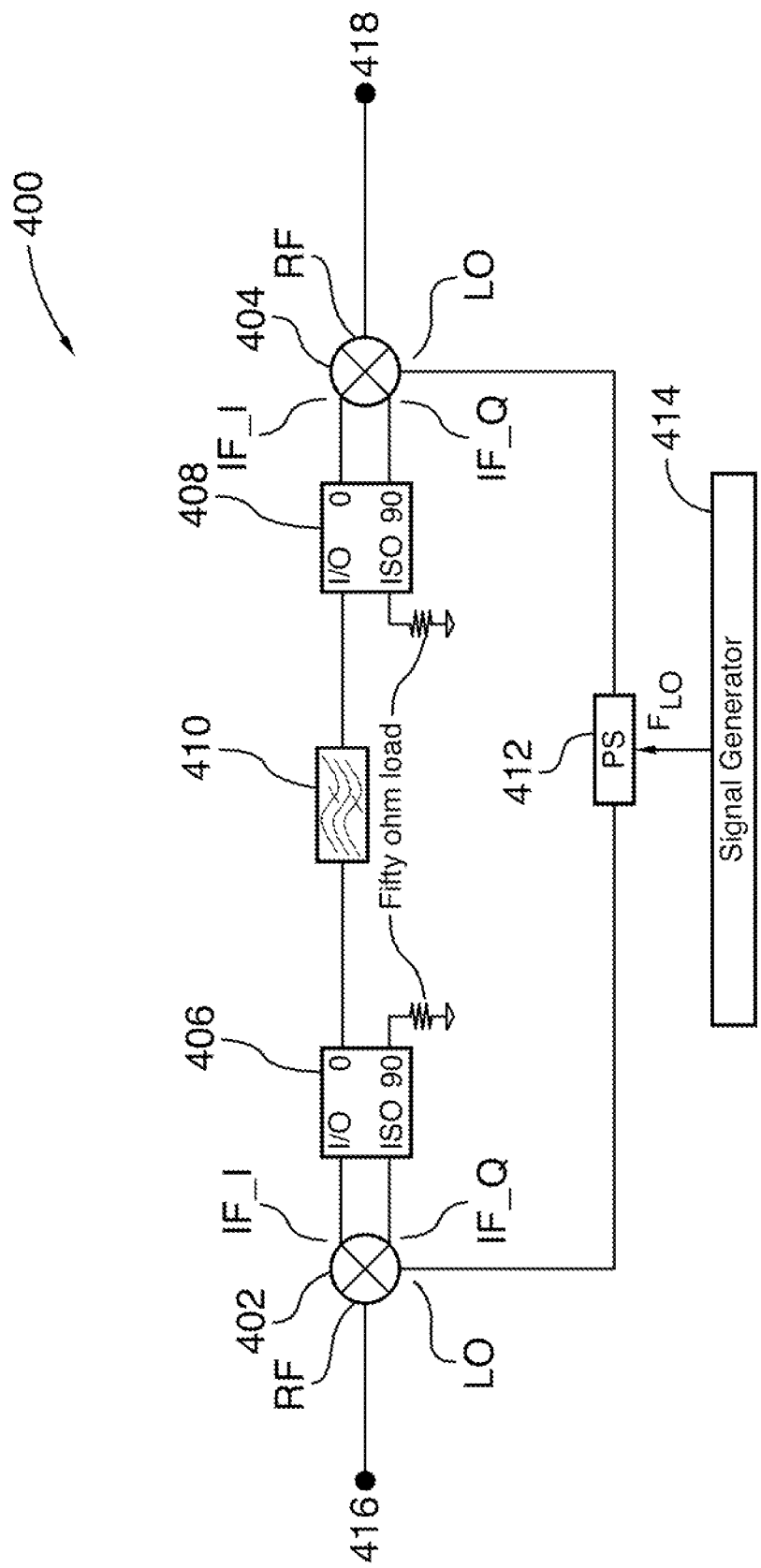
FIG. 4 is a block diagram of an electronically tunable filter, according to various embodiments.

Various embodiments disclosed herein relate to electronically tunable filter. FIG. 4 illustrates a block diagram of an electronically tunable filter (ETF) 400 according to various embodiments disclosed herein. ETF 400 includes two image rejection mixers 402 and 404, two hybrid couplers 406 and 408, a filter 410, a power splitter (PS) 412, which receives an input control signal Flo from a signal generator 414. Filter 410 may be referred to as an internal filter. ETF 400 also includes a first port 416, which will also be referred to as "port 1", and a second port 418, which will also be referred to as "port 2". In some embodiments of ETF 400, power splitter 412 comprises a Wilkinson power splitter for generating the balanced LO drive signal and also providing isolation between the LO ports of the two image rejection mixers 402 and 404. Other embodiments of ETF 400 utilize a resistive splitter, which has the advantage of broader operating bandwidth but reduced isolation. A resistive splitter was used for the measurement data disclosed herein.

Figure 5:
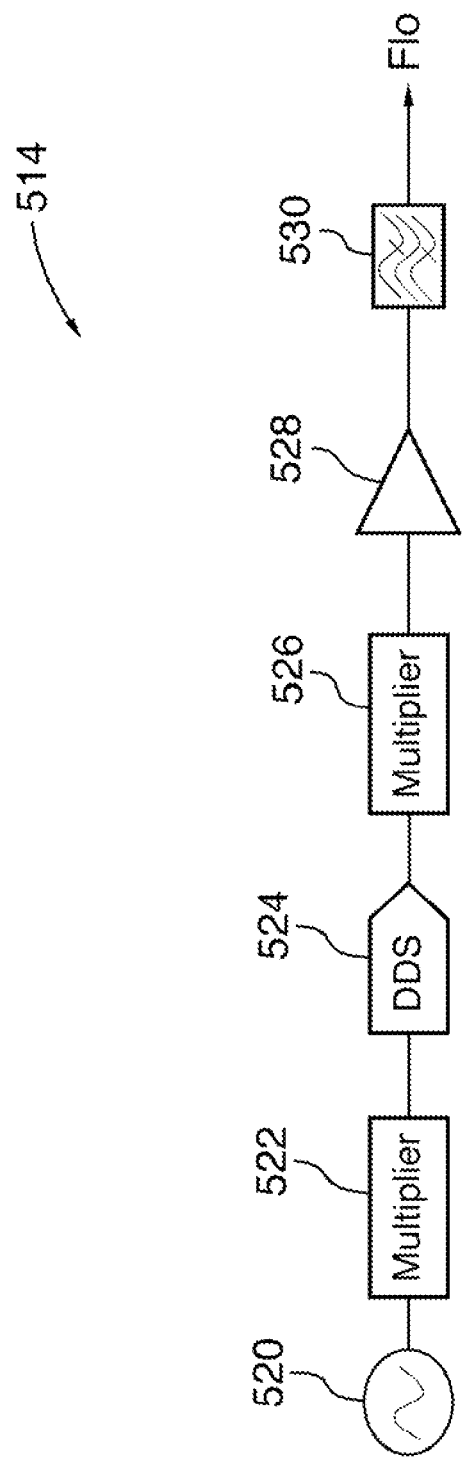
FIG. 5 is a block diagram of direct digital synthesizer (DDS) signal generator.

Reference is now made to FIG. 5, which illustrates a block diagram of direct digital synthesizer (DDS) signal generator 514. Some embodiments of ETF 400 utilize generator 514 as signal generator 414 to create the control signal that is applied to PS 412. The DDS signal generator 514 includes a stable reference oscillator 520 which is multiplied up to the required clock frequency for the DDS 524 by reference oscillator multiplier 522. The DDS 524 output is further multiplied by DDS frequency multiplier 526 to the required frequency band of operation for the filter 530. Output amplification (by amplifier 528) and filtering (by low pass filter 530) is then used to set the DDS output power level to the required drive level for the LO ports of the image rejection mixers 402 and 404 and the output low pass filter 530 acts to reject harmonics resulting from the DDS signal multiplication. In various embodiments, the DDS signal generator 514 enables the filter frequency band of operation to be adjusted in steps of less than 1 Hz.

In various embodiments, ETF 400 operates as follows. The signal to be filtered is applied to either port 416 or port 418 of the filter 400. The filter characteristic is different depending on which port operates as the input and which as the output. Assuming, for the present discussion, that port 416 is used as the input of the filter 400 a signal applied at port 416 is down converted by image rejection mixer 402. The down conversion is achieved by mixing the frequency control signal with the input signal. The frequency control signal is applied at the local oscillator port of the image rejection mixer 402. The intermediate in phase and quadrature signals from the image rejection mixer 402 are applied to a 90 degree hybrid coupler 406. In some embodiments, the isolation port of the coupler 406 is terminated in a fifty ohm load 420. The output port of the coupler 406 combines the in phase and quadrature outputs of the image rejection mixer 402 which result in suppression of the upper sideband and enhancement of the lower sideband. Such operation and configuration of the image rejection mixer 406 is well known to those skilled in the art. The image rejection mixer 406 also rejects the local oscillator output from the IF port resulting in a single sideband output.

Figure 7:
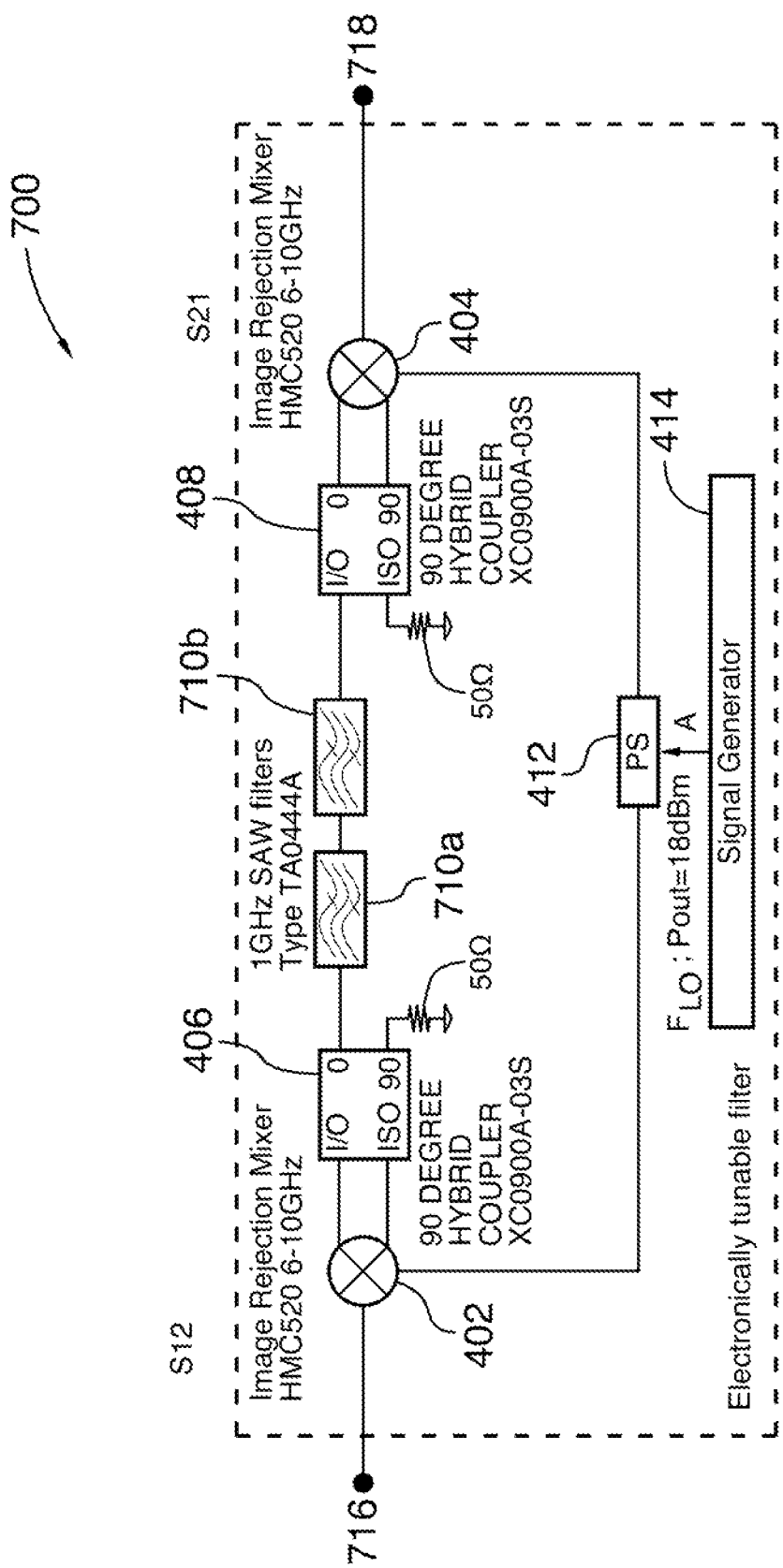
FIG. 7 is a block diagram of an electronically tunable filter, according to various embodiments.

The output from the hybrid coupler 406 is fed through a filter 410. In the measurement data a cascade of two narrow-band a high quality factor surface acoustic wave filters is used as illustrated in FIG. 7. The surface acoustic wave filter is fixed frequency and as such can be designed to provide sharp transition bands and narrow bandwidth.

The output pass band from the filters is applied to a second hybrid coupler 408, which splits the signal into in phase (I) and quadrature (Q) components. The I and Q signals are applied to the second image rejection mixer 404. The local oscillator to the second image rejection mixer 404 is the same source as applied to the first image rejection mixer 402, as such the up-conversion through the second image rejection mixer 404 restores the input signal to its original frequency value. The second image rejection mixer 404 and associated hybrid coupler 408 is configured to support the upper sideband so as to restore the input signal to its original frequency.

Figure 6:
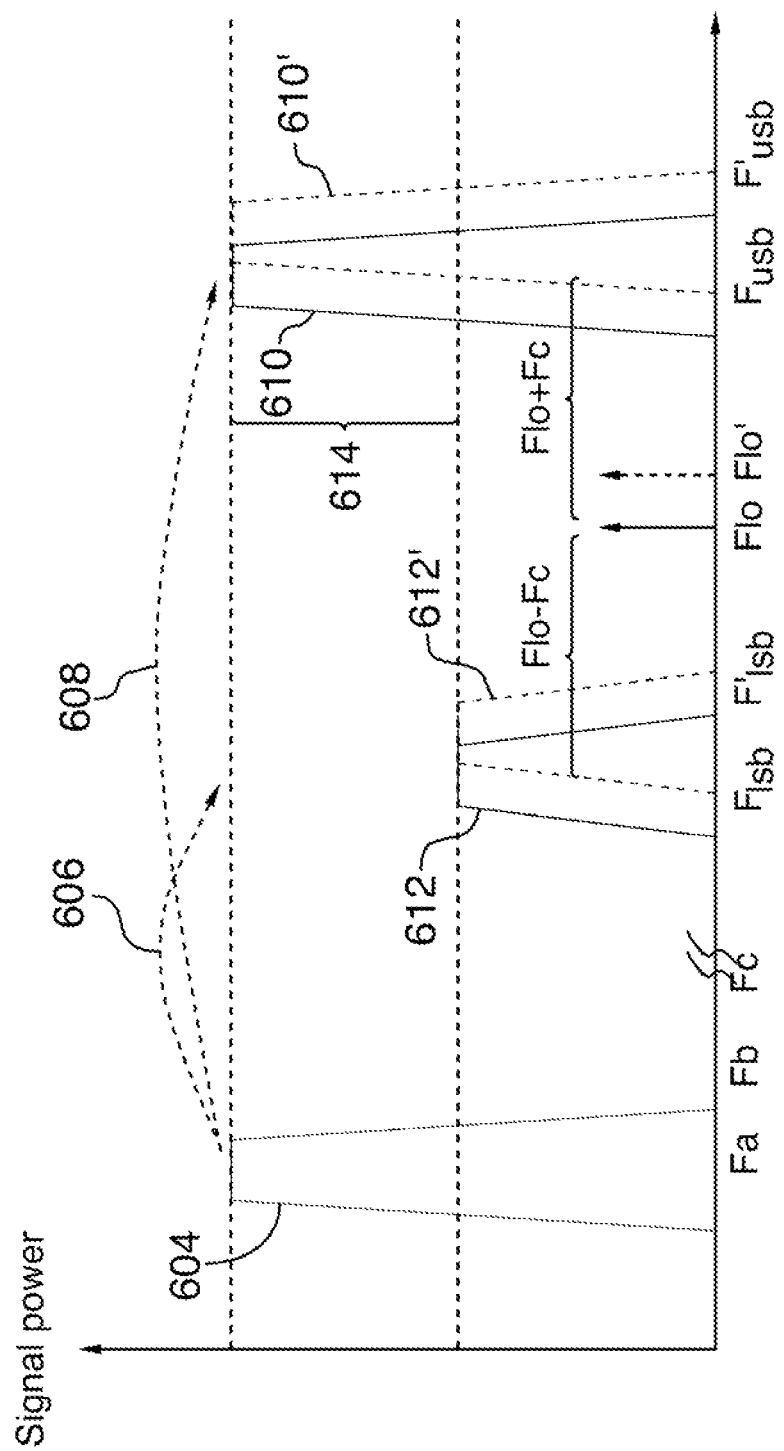
FIG. 6 is a graph of the electronically tunable pass band response of the electronically tunable filter of FIG. 4.

Reference is now made to FIG. 6, which illustrates a graph of the electronically tunable pass band response of ETF 400 as a function of the LO control frequency. The effect of the dual conversion process of the ETF 400 is to transpose the fixed frequency filter characteristic 604 to a frequency equal to the center frequency Fc of the filter characteristic plus that of the control signal frequency Flo. The consequence of this operation is that the center frequency of the transposed filter characteristic (Flo+Fc) can be adjusted by setting of the control signal frequency Flo. Use of a DDS based control signal generator 514, as illustrated in FIG. 5, enables the filter center frequency to be adjusted in frequency steps below 1 Hz. This is indicated by Flo' which illustrates one possible adjusted value of Flo. The use of Flo' instead of Flo would result in upper and lower sidebands 610' and 612' that are shifted up in frequency as compared to upper and lower sidebands 610 and 612 illustrated in FIG. 6.

The transposition of the low frequency filter characteristic 604 to frequencies determined by Flo is indicated by arrows 606 and 608. Arrow 608 shows the low frequency filter characteristic 604 transposed to the upper sideband pass band 610 centered at Flo+Fc=$F_{usb}$. Arrow 606 shows the low frequency filter characteristic 604 transposed to the low sideband pass band 612 centered at Flo−Fc=$F_{lsb}$. The lower sideband is suppressed as shown by the difference in signal power 614. Typically the image rejection is approximately 30 dB.

An example is using a 1 GHz center frequency filter in combination with a 9 GHz control signal frequency will transpose the pass band filter characteristic to a center frequency of 10 GHz.

If the filter is used such that port 416 is the filter output and port 418 is the input then the filter pass-band characteristic of the lower sideband becomes the operational mode. Based on the previous example a 9 GHz control signal and 1 GHz center frequency filter would result in transposition of the filter pass-band characteristic to 8 GHz. As explained above, FIG. 6 illustrates the transposition of the filter characteristic and the dependence of the filter center frequency on the control signal frequency.

FIG. 7 illustrates an ETF 700 that utilizes two saw filters 710a and 710b. ETF 700 also includes analogous features described above in relation to ETF 400 of FIG. 4. These features are similarly numbered and their description will not be repeated here. Some embodiments of ETF 700 can be considered to be a subset of the embodiments of ETF 400. For example, some embodiments of ETF 700 correspond to ETF 400 where filter 410 is implemented using two saw filters 710a and 710b.

Figure 8A:
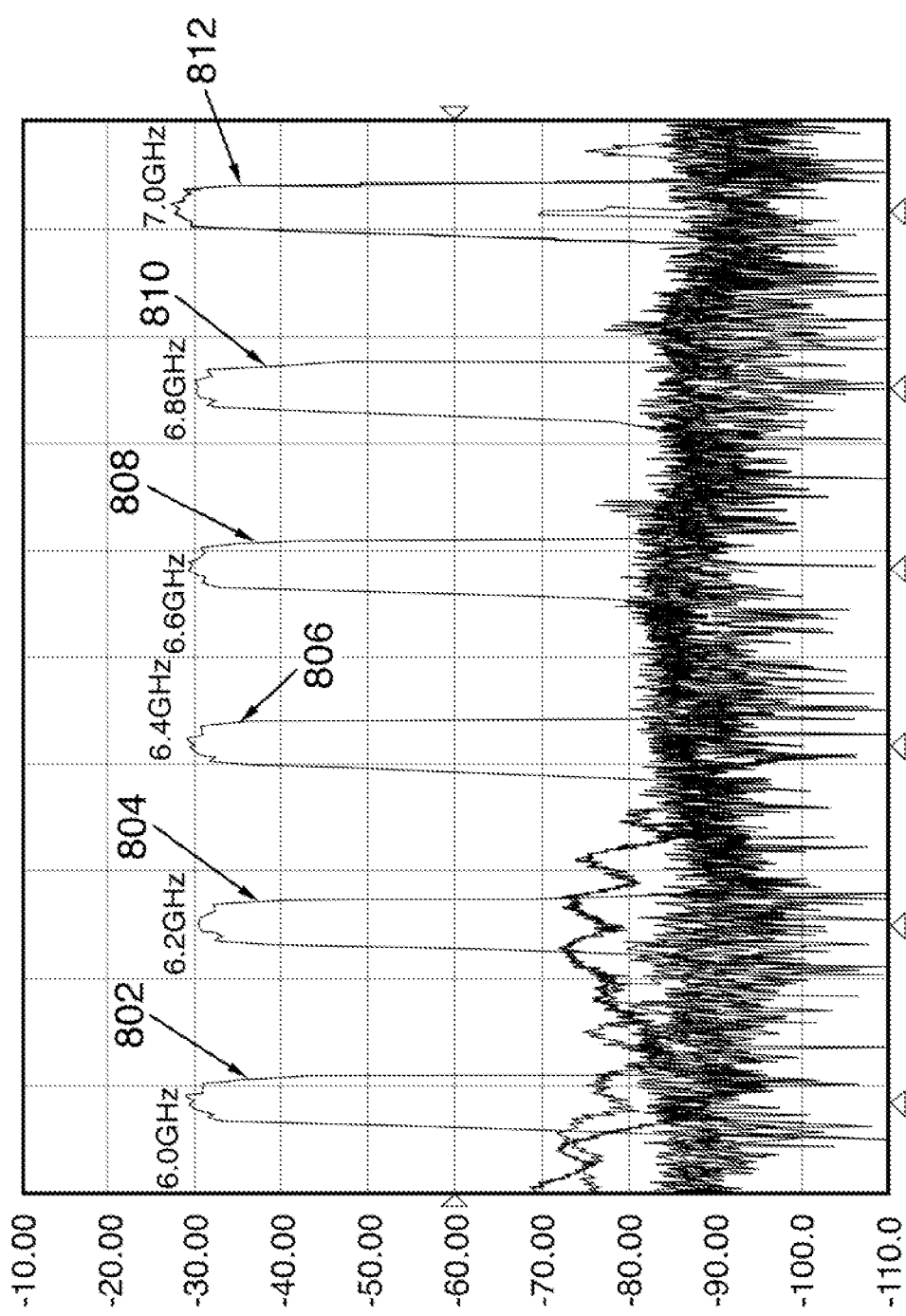
FIGS. 8A and 8B illustrate measured performance data for a band-pass mode operation of the filter of FIG. 7.
Figure 8B:
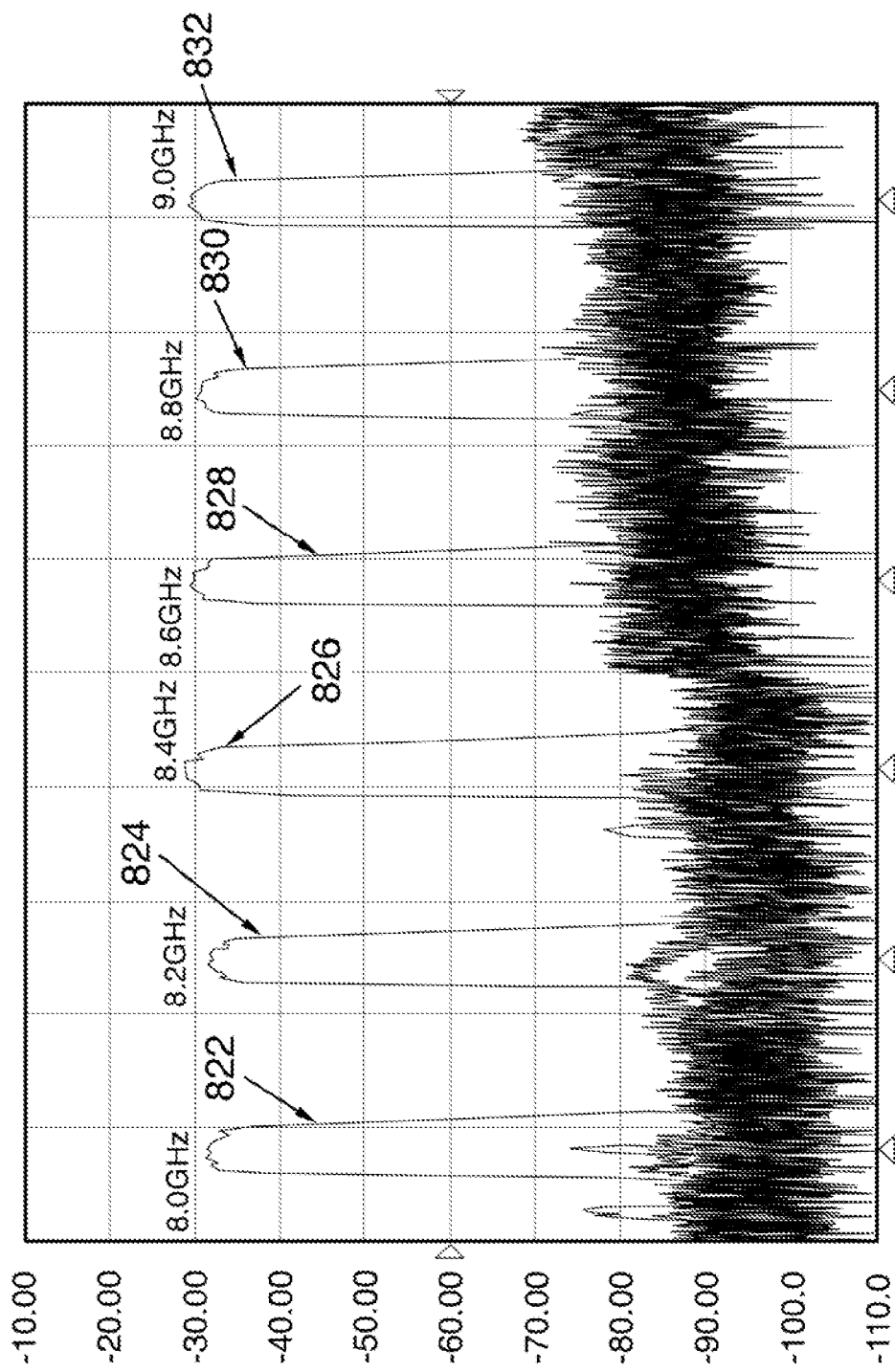

Measured performance data for the band-pass mode operation of filter 700 is shown in FIGS. 8A and 8B. Reference is first made to FIG. 8A, which illustrates 6 different band-pass filter operation modes represented by the traces 802, 804, 806, 808, 810 and 812. Each of the traces 802, 804, 806, 808, 810 and 812 illustrate sharp band pass characteristics centered at frequencies 6.0 GHz, 6.2 GHz, 6.4 GHz, 6.6 GHz, 6.8 GHz, and 7.0 GHz, respectively. Similarly, FIG. 8B also illustrates 6 different band-pass filter operation modes represented by the traces 822, 824, 826, 828, 830 and 832. Each of the traces 822, 824, 826, 828, 830 and 832 illustrate sharp band pass characteristics centered at frequencies 8.0 GHz, 8.2 GHz, 8.4 GHz, 8.8 GHz, 8.8 GHz, and 9.0 GHz, respectively. Note, the pass band characteristics shown in FIGS. 8A and 8B are snap shots of the filter characteristic as the filter center frequency is adjusted across the operating band. The frequencies illustrated are samples only and the differences between example frequencies do not represent the size of the steps by which the operation of the filter can be adjusted. As mentioned above, in some embodiments, the operation of the ETF can be adjusted in steps of less than 1 Hz. In addition, the illustrated range is an example only and is not intended to illustrate the limits of the operating range of the ETF.

Figure 9:
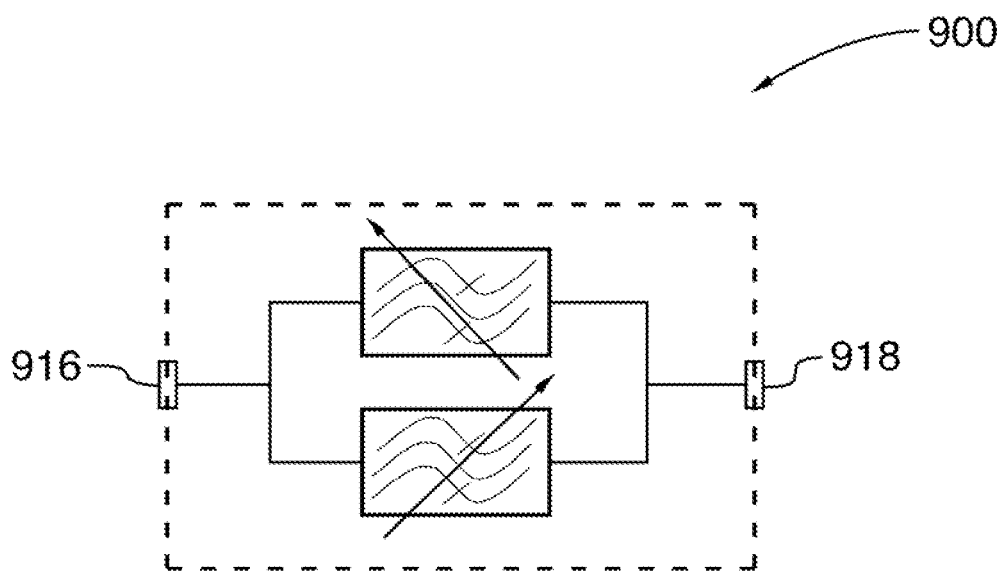
FIG. 9 illustrates a circuit symbol for an electronically tunable filter according to various embodiments disclosed herein.

FIG. 9 illustrates a circuit symbol 900 which will be used to designate various embodiments of the ETF of the present disclosure, such as, for example, ETFs 400, 1100 and 1500.

Figure 10:
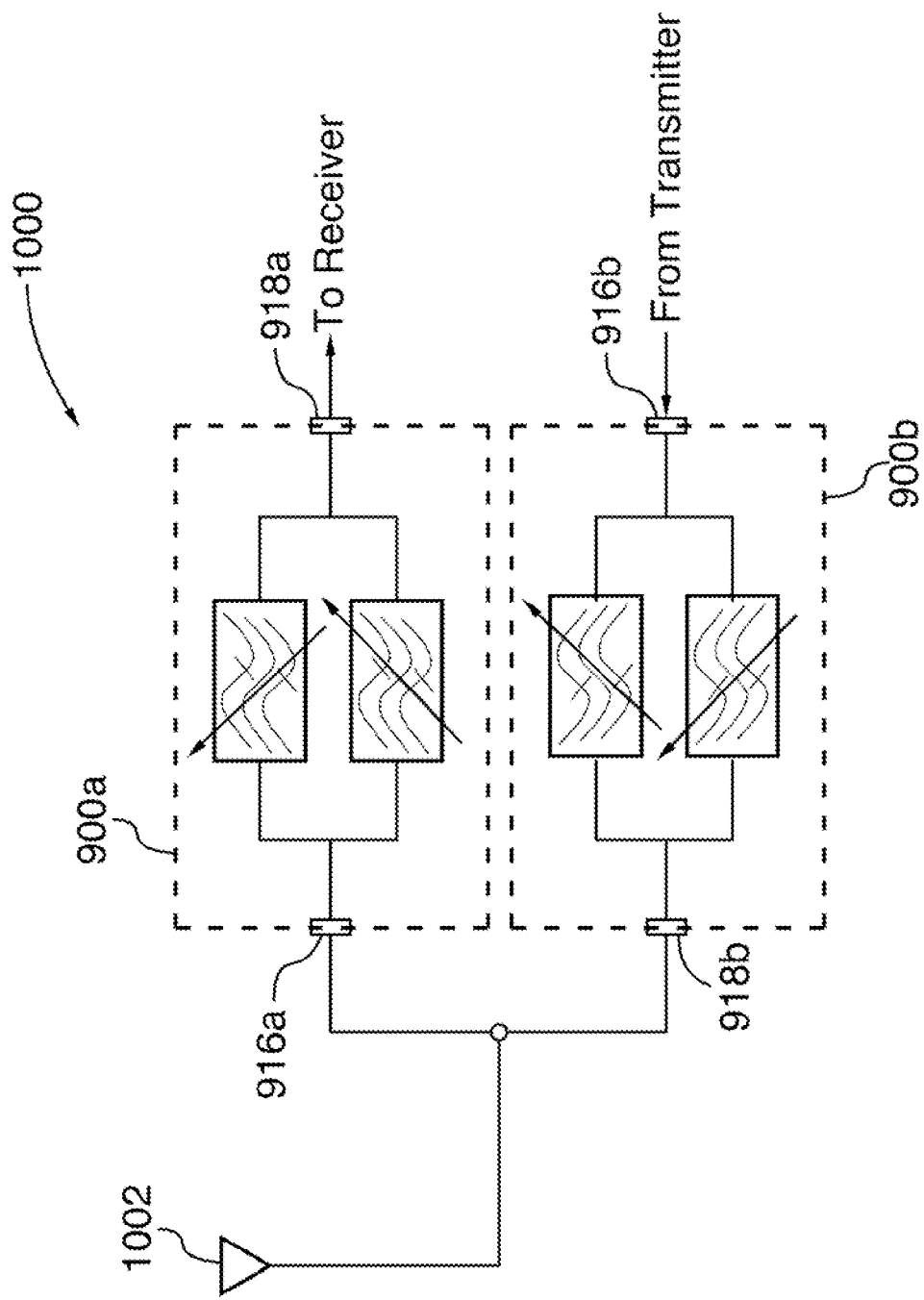
FIG. 10 illustrates a system including a duplex filter, according to various embodiments.

The non-reciprocal operating mode of the filter enables the filter to be operated as a tunable duplex filter. FIG. 10 illustrates a system 1000 in which two ETF filters 900a and 900b are used, which enables independent control of the duplex distance. Port 916a of ETF 900a and port 918b of ETF 900b are coupled to antenna 1002. Port 918a of ETF 900a is coupled to the receiver (not illustrated). Port 916*b* of ETF 900*b* is coupled to the transmitter (not illustrated).

The fixed frequency filter component can be selected based on the requirements of the ETF. The filter bandwidth will determine the pass band at the transposed frequency. The transition band of the fixed frequency filter will determine the transposed filter transition band frequencies. As such the high performance parameters of a fixed frequency filter can be transposed to the operating band of the system and then the transposed filter center frequency electronically adjusted.

Figure 11:
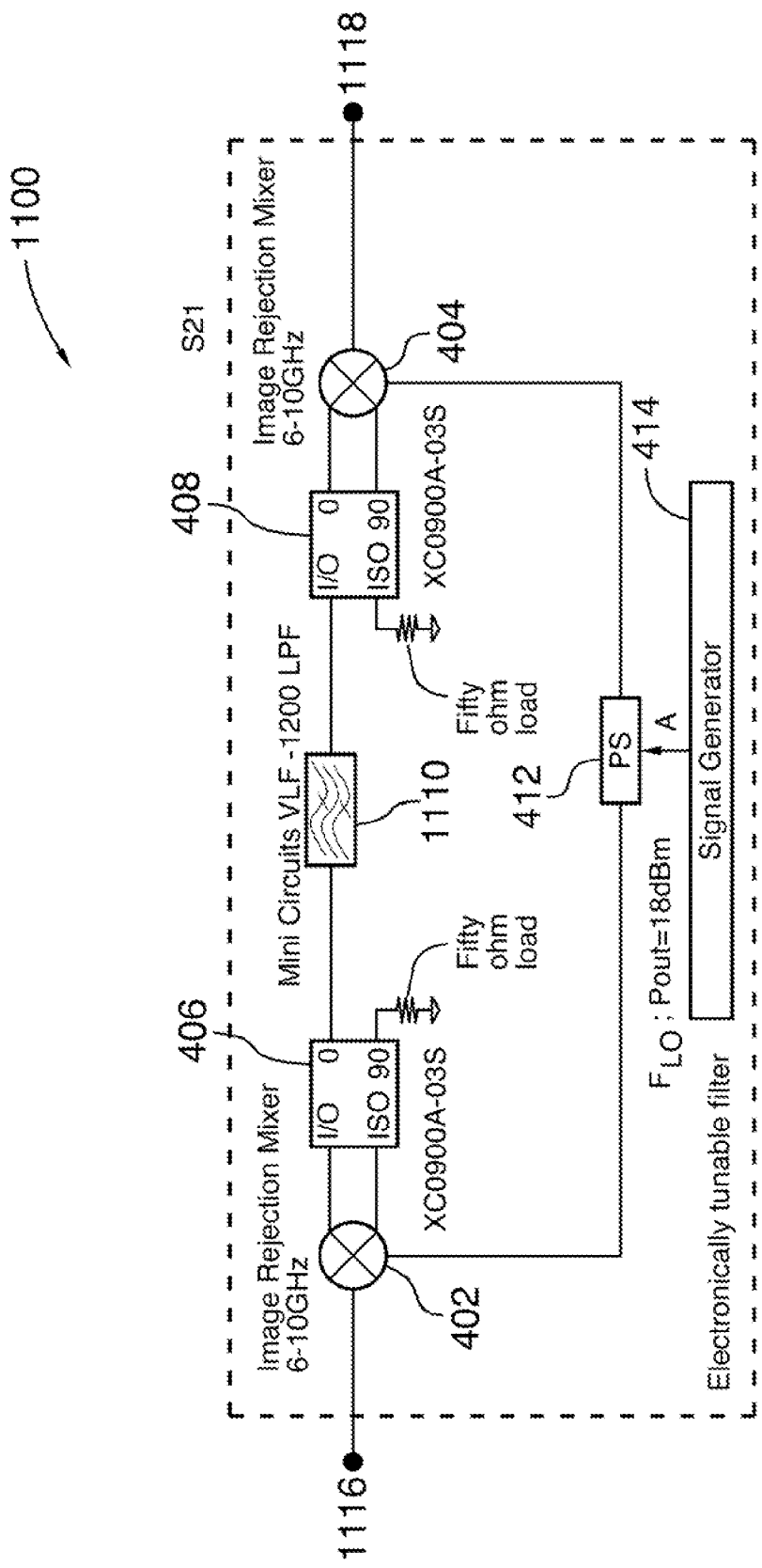
FIG. 11 is a block diagram of an electronically tunable filter, according to various embodiments.

In addition to use of a band-pass filter, the fixed frequency filter can be changed to a low pass filter. FIG. 11 illustrates an ETF 1100 that utilizes a low pass filter 1110. ETF 1100 also includes analogous features described above in relation to ETF 400 of FIG. 4. These features are similarly numbered and their description will not be repeated here. Some embodiments of ETF 1100 can be considered to be a subset of the embodiments of ETF 400. For example, some embodiments of ETF 1100 correspond to ETF 400 where filter 410 is implemented using a low pass filter 1110.

When placed in the ETF 1100 circuit, the low pass corner frequency can be transposed to the corner frequency plus the control signal frequency for upper sideband operation. The corner frequency of the resultant transposed low pass filter can then be set through the control signal frequency. Reversing the ports 1116 and 1118 of the transposed low pass ETF converts it into a transposed high pass filter. The low pass filter transposition properties of the ETF are extremely powerful as they enable a low pass filter to be converted to a high or low pass filter characteristic at the transposed frequency.

Figure 12A:
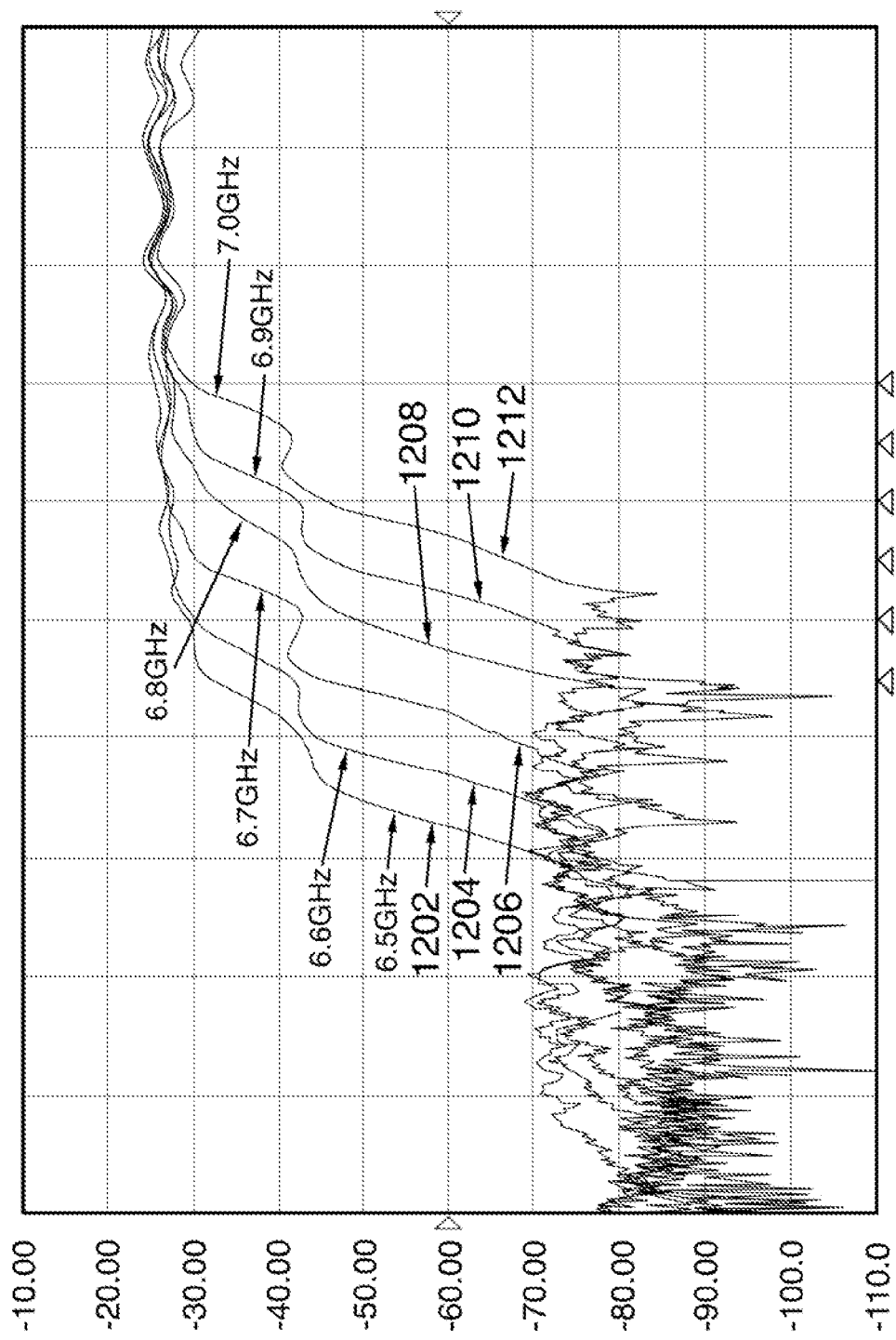
FIG. 12A illustrates measured performance data for a high pass mode operation of the filter of FIG. 11.

Measurement data for an ETF 1100 configured as a low and high pass filter is illustrated in FIGS. 12A and 12B. Reference is first made to FIG. 12A, which illustrates 6 different high pass filter operation modes represented by the traces 1202, 1204, 1206, 1208, 1210 and 1212. Each of the traces 1202, 1204, 1206, 1208, 1210 and 1212 illustrate high pass characteristics with corner frequencies 6.5 GHz, 6.6 GHz, 6.7 GHz, 6.8 GHz, 6.9 GHz, and 7.0 GHz, respectively. Similarly, FIG. 12B also illustrates 6 different low pass filter operation modes represented by the traces 1222, 1224, 1226, 1228, 1230 and 1232. Each of the traces 1222, 1224, 1226, 1228, 1230 and 1232 illustrate low pass characteristics with corner frequencies 9.3 GHz, 9.4 GHz, 9.5 GHz, 9.6 GHz, 9.7 GHz, and 9.8 GHz, respectively. The frequencies illustrated are samples only and the differences between example frequencies do not represent the size of the steps by which the operation of the filter can be adjusted. As mentioned above, in some embodiments, the operation of the ETF can be adjusted in steps of less than 1 Hz. In addition, the illustrated range is an example only and is not intended to illustrate the limits of the operating range of the ETF.

Cascading a high and low pass ETF enables a filter that has an adjustable band-pass characteristic and center frequency. In this fully adjustable band pass filter the filter corner frequencies are set by the frequency of the two control signals.

Figure 13A:
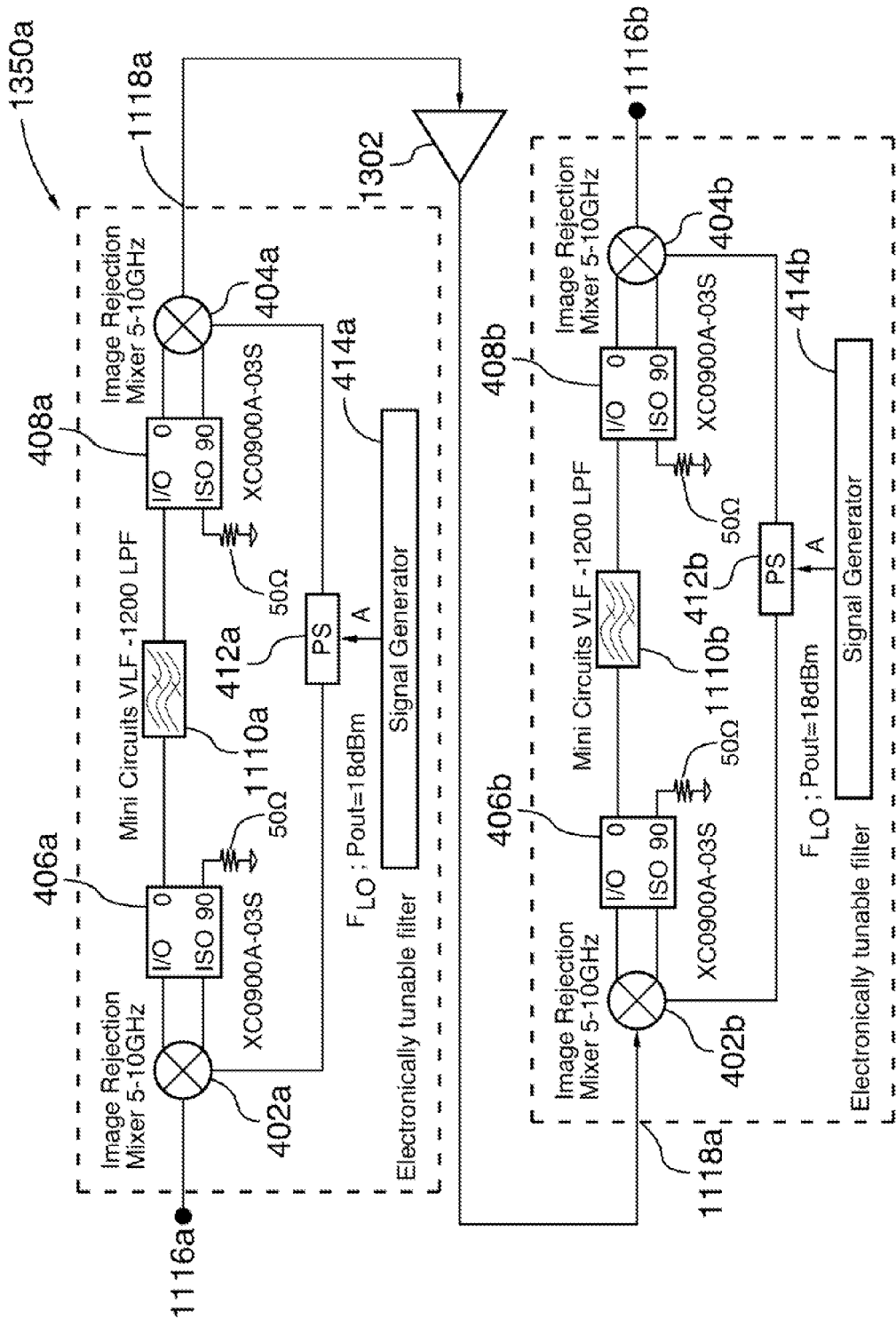
FIG. 13A illustrates an adjustable band-pass filter system, according to various embodiments.

FIG. 13A illustrates various embodiments of an adjustable band-pass filter system 1350*a*. In FIG. 13A an isolation amplifier 1302 is placed between the two ETF components 1100*a* and 1100*b* to prevent reflected signals between the two components (1100*a* and 1100*b*) and to provide an impedance match.

Figure 13B:
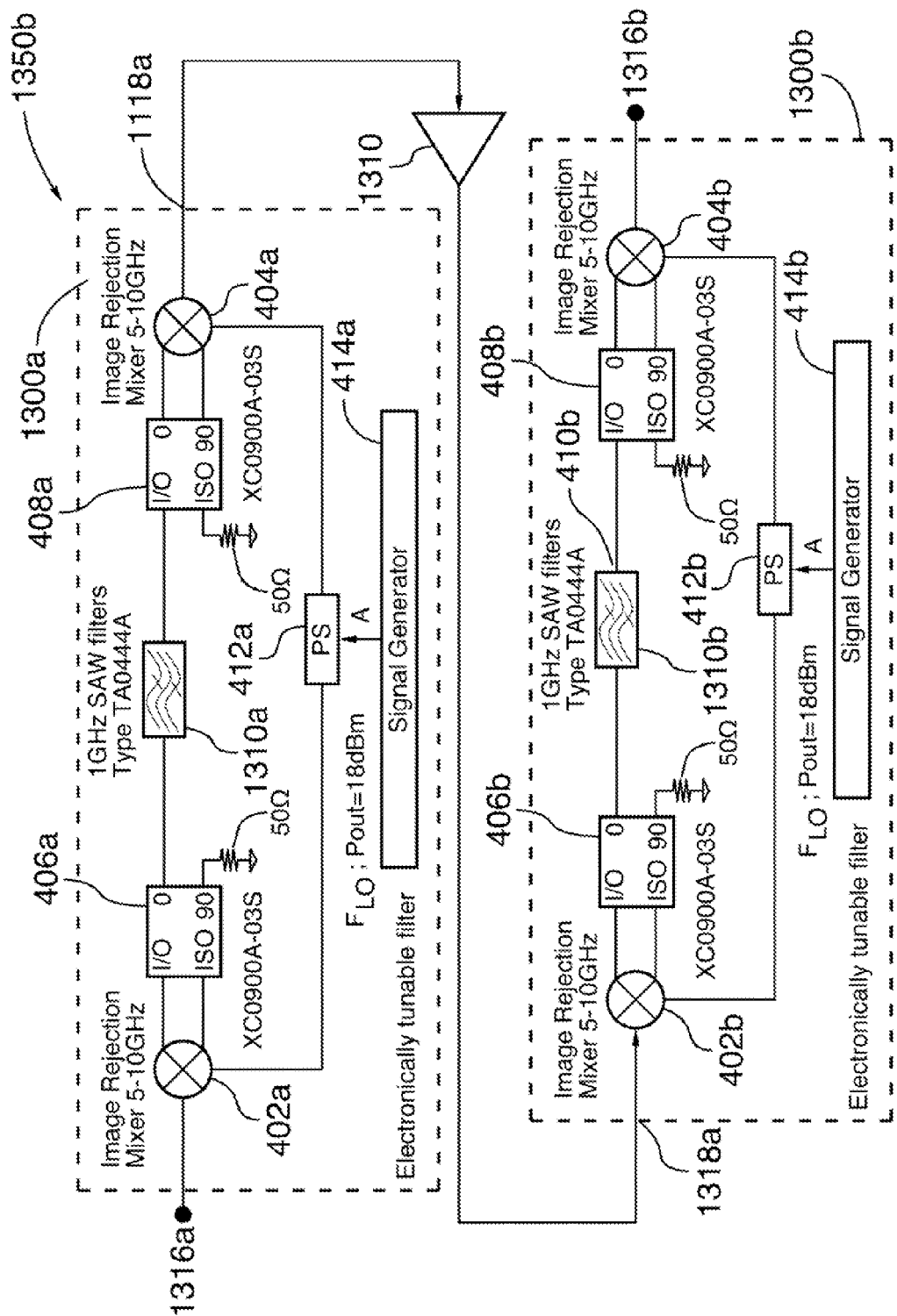
FIG. 13B illustrates an adjustable band-pass filter system, according to various embodiments.
Figure 13C:
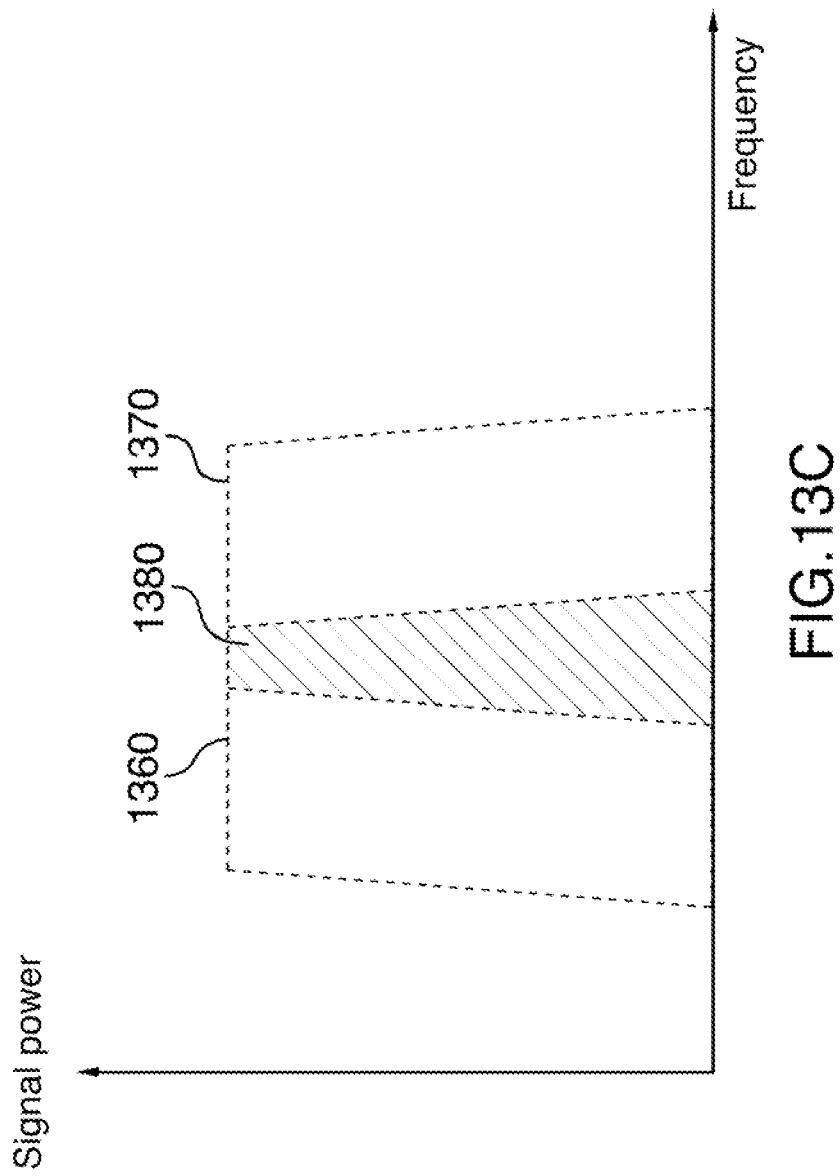
FIG. 13C is a graph illustrating filter band settings.

FIG. 13B illustrates various embodiments of an adjustable band-pass filter 1350*b*. In various embodiments, filter 1350*b* is similar to filter system 1350*a* with the main difference being that low pass filters 1110*a* and 1110*b* are replaced with band pass filters 1310*a* and 1310*b*. In the embodiments illustrated in FIG. 13B, an adjustable bandwidth filter is realized when the two filter characteristics are made to overlap, as illustrated in FIG. 13C. Pass band 1360 corresponds to the pass band of ETF 1300*a* and pass band 1370 corresponds to the pass band of ETF 1300*b*. The resulting pass band 1380 of filter system 1350*b* corresponds to the overlap of pass bands 1360 and 1370.

An advantage of the configuration of FIG. 13B is that the overall filter band width can be made narrower than the individual fixed frequency filters used in the design. An example is the use of filters with 1 GHz center frequency that are overlapped by 200 KHz. The net result is a 200 KHz filter pass band that can be adjusted across the operating bandwidth of the system.

It should be understood that, as with other diagrams of the present disclosure, the examples illustrated in FIGS. 13A and 13B are examples only. For example, different types of filters could be used than those illustrated to achieve similar or different results, as will be apparent to those of skill in the art based on the present disclosure. As an example, in place of the SAW filters illustrated in FIG. 13B, dielectric resonators notch filters can be used in some embodiments. Replacing the band-pass filter of the ETF with a notch filter enables a frequency tunable notch filter that can be adjusted to eliminate specific frequency components of a received signal.

In addition, although FIGS. 13A and 13B illustrate filter systems comprising two cascaded ETFs, a filter system can be constructed by cascading an arbitrary number of ETFs. Furthermore, although FIGS. 13A and 13B illustrate filter systems that use the same type of filter in each ETF, it is not necessary that each filter in a cascaded ETF filter system be of the same type. For example, in the same filter system, one ETF can utilize a low pass filter while another ETF in the same system can utilize a high pass filter.

Figure 14:
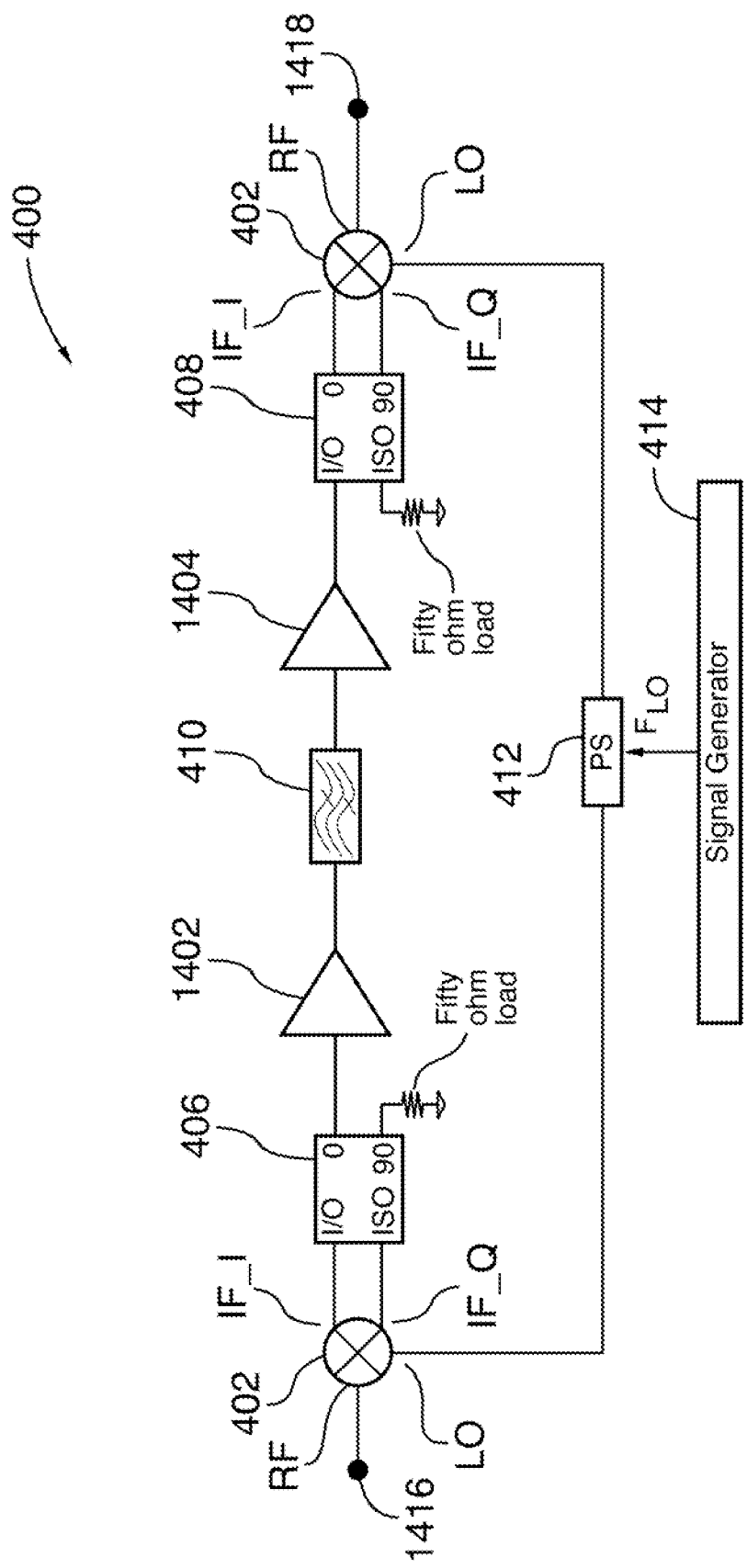
FIG. 14 is a block diagram of an electronically tunable filter, according to various embodiments.

The configuration of the ETF can be modified to incorporate amplification stages around the filter components to compensate for the filter loses. FIG. 14 illustrates the possible location for such amplification stages. FIG. 14 is a block diagram of ETF 1400. ETF 1400 includes amplifiers 1402 and 1404 on either side of filter 410. ETF 1400 also includes analogous features described above in relation to ETF 400 of FIG. 4. These features are similarly numbered and their description will not be repeated here.

It should be noted that since, in some embodiments, the ETF 1400 uses a fixed filter the amplification applied about the filter can be at the frequency of the filter and consequently significantly lower than the frequency at which the filter operates. The option to use a narrow band amplifier in a broad band design has significant advantage in terms of cost and component availability. It should also be noted that use of the amplification stages in the manner illustrated in FIG. 14 fixes the input and output port of the filter.

Figure 15:
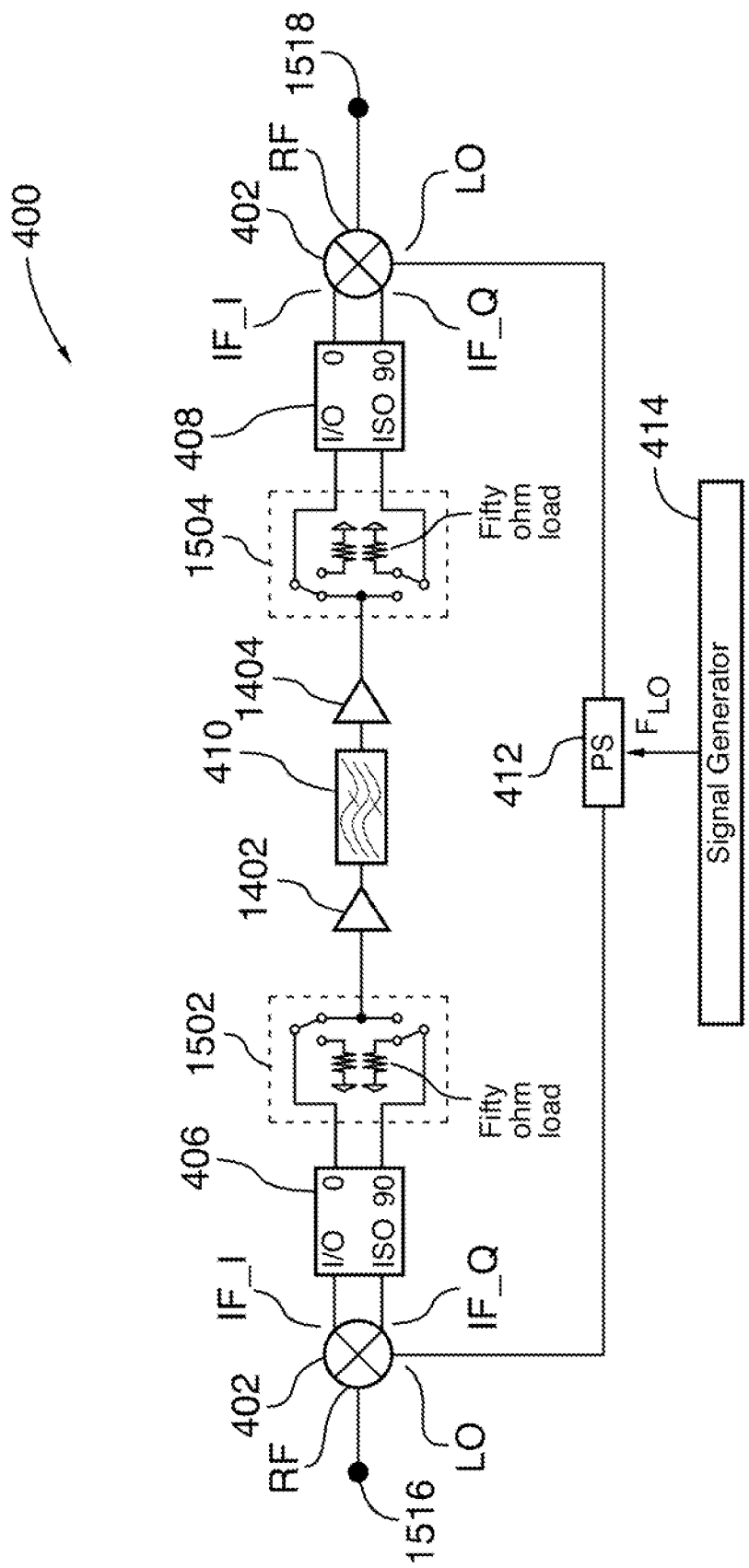
FIG. 15 is a block diagram of an electronically tunable filter, according to various embodiments.

FIG. 15 illustrates a block diagram of an ETF 1500 that includes control switches 1502, 1504 between amplifiers 1402, 1404 and hybrid couplers 406, 408.

Placement of control switches 1502 and 1504, as shown in FIG. 15 enables the upper and lower sideband operation of the filter to be selected for the same orientation of the filter. The operating bandwidth of the band pass filter with the mode switches in place is extended as the ETF can now transpose the filter characteristic to either the upper or lower sideband without having to change the orientation of the filter. In the case that the band pass filter is replaced with a low pass filter the sideband switches operate to convert the filter characteristic between low pass and high pass operation.

Placement of a low pass filter in the system of FIG. 15 in place of the band pass filter will result in a high pass or low pass filter depending on the setting of the switches.

Various embodiments of the invention described to this point are band-pass, low pass, high pass and stop band electronically tunable filters operating in the radio frequency domain. The described ETF function can be translated to other regions of the frequency spectrum, for example ultrasonic, infra-red and optical frequency bands. In fact for those skilled in the art, the ETF can be applied to any domain that supports the core component functionalities.

Various embodiments described above make use of a DDS for generation of the control signal, however, the invention is not limited to the use of a DDS based control signal. Any system or circuit capable of generating a signal which meets the local oscillator port requirements of the mixers and the frequency adjustment requirements can be used.

Various embodiments disclosed herein provide a unique technical advantage over conventional filter topologies in that they provide a means to use a fixed frequency filter having sharp transition bands and narrow pass band characteristics in applications requiring frequency agility and selectivity with respect to the system operating frequency band and channel spacing and electronic control over the low pass or high pass characteristic.

Various embodiments described herein can be operated as a tunable duplex filter in a frequency agile radio transceiver system, such as system 1000 illustrated in FIG. 10.

Figure 16:
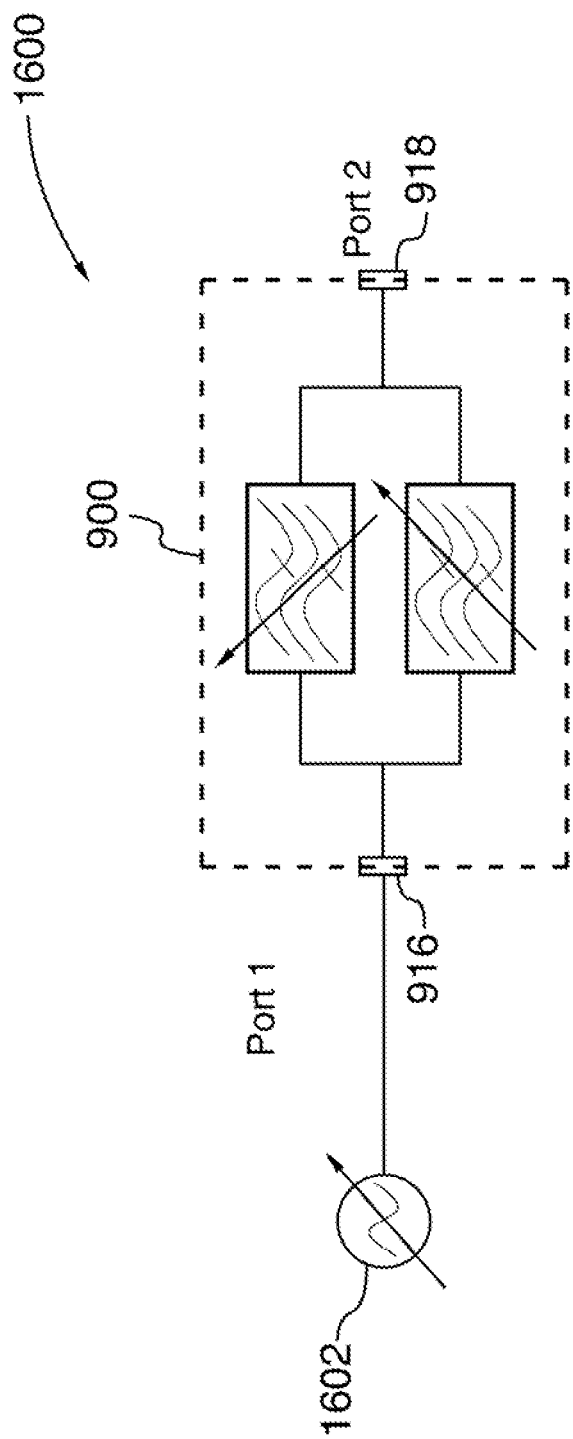
FIG. 16 is a block diagram of a system including a signal source harmonic rejection filter.

Some embodiments of the invention will find application as a frequency synthesizer harmonic rejection filter. Examples of such embodiments include some embodiments of system 1600 of FIG. 16. System 1600 comprises a frequency synthesizer 1602 coupled to port 916 ETF 900 operated as a low pass filter. In FIG. 16, an electronically tunable filter is utilized as a signal source harmonic rejection filter. Conventional systems employ a switched filter bank. Various embodiments disclosed herein would replace such a filter bank resulting in design size reduction and increase in the design flexibility.

Some embodiments disclosed herein can be used to transpose a frequency notch to a specific frequency band to eliminate unwanted spurious. Similarly, various embodiments of the ETF can be used as a narrow band tracking filter to reduce out of band spurious from sources such as DDS.

The above-described embodiments are intended to be examples only. Alterations, modifications and variations can be effected to the particular embodiments by those of skill in the art without departing from the scope, which is defined solely by the claims appended hereto.

The invention claimed is:

1. An electronically tunable filter, the filter comprising:
a first image rejection mixer;
a second image rejection mixer;
a first hybrid coupler, the first hybrid coupler being coupled to the first image rejection mixer;
a second hybrid coupler, the second hybrid coupler being coupled to the second image rejection mixer;
an internal filter coupled to the first hybrid coupler and the second hybrid coupler;
a control port for receiving a control signal;
a power splitter coupled to the control port, the first image rejection mixer, and the second image rejection mixer;
a first port coupled to the first image rejection mixer; and
a second port coupled to the first image rejection mixer.

2. The electronically tunable filter of claim 1, further comprising a signal generator coupled to the control port for providing the control signal.

3. The electronically tunable filter of claim 2, wherein the signal generator comprises a direct digital synthesizer.

4. The electronically tunable filter of claim 3, wherein a frequency band of operation of the filter is adjustable in steps of less than 1 Hz.

5. The electronically tunable filter of claim 1, wherein each of the first port and the second port is operable as either an input port or an output port.

6. The electronically tunable filter of claim 1, wherein the internal filter comprises:
a first narrowband surface acoustic wave filter; and
a second narrowband surface acoustic wave filter, the first and second narrowband surface acoustic wave filters being coupled in a cascade.

7. The electronically tunable filter of claim 6, wherein the first and second narrowband surface acoustic wave filters are configured to provide sharp transition bands and narrow bandwidth.

8. The electronically tunable filter of claim 1, further comprising:
a first amplifier coupled between the first hybrid coupler and the internal filter; and
a second amplifier coupled between the internal filter and the second coupler.

9. The electronically tunable filter of claim 8, further comprising:
a first switch coupled between the first amplifier and first hybrid coupler; and
a second switch coupled between the second amplifier and the second hybrid coupler.

10. A filter system comprising:
a first electronically tunable filter according to claim 1; and
a second electronically tunable filter according to claim 1, the second electronically tunable filter coupled to the first electronically tunable filter.

11. The filter system of claim 10, wherein the first and second electronically tunable filters are coupled in series.

12. The filter system of claim 11, further comprising an amplifier coupled between the first electronically tunable filter and the second electronically tunable filter.

13. The filter system of claim 11, wherein the filter system is configured to operate as an adjustable band pass filter by:
operating the first electronically tunable filter as a low pass filter; and
operating the second electronically tunable filter as a high pass filter.

14. The filter system of claim 11, wherein the filter system is configured to operate as an adjustable band pass filter by:
operating the first electronically tunable filter as a band pass filter having a first pass band; and
operating the second electronically tunable filter as a band pass filter having a second pass band.

15. The filter system of claim 14, wherein the first pass band and the second pass band are overlapped to achieve a third pass band, the third pass band having a frequency range smaller than a frequency range of either the first or second pass band.

16. The filter system of claim 10, wherein the first and second electronically tunable filters are coupled in parallel.

17. The filter system of claim 16, wherein the filter system is operated as a duplex filter.

18. A source harmonic rejection filter comprising:
a frequency synthesizer; and
an electronically tunable filter according to claim 1, the first port of the filter being coupled to an output of the frequency synthesizer.

* * * * *